United States Patent [19]

Cuckson et al.

[11] 4,414,505
[45] Nov. 8, 1983

[54] MICROWAVE INSTANTANEOUS FREQUENCY MEASUREMENT APPARATUS

[75] Inventors: Harry Cuckson, Farnham; Peter D. Curtis, Pangbourne, both of England

[73] Assignee: The Secretary of State for Defence in Her Britannic Majesty's Government of the United Kingdom of Great Britain and Northern Ireland, London, England

[21] Appl. No.: 285,524

[22] Filed: Jul. 21, 1981

[30] Foreign Application Priority Data

Jul. 25, 1980 [GB] United Kingdom ................. 8023981

[51] Int. Cl.³ ............................................. G01R 25/00
[52] U.S. Cl. ......................................... 324/85; 324/84
[58] Field of Search ....................... 324/81, 84, 85, 95

[56] References Cited

U.S. PATENT DOCUMENTS

| | | | |
|---|---|---|---|
| 3,319,165 | 5/1967 | Hamlin et al. | 324/84 |
| 3,416,077 | 12/1968 | Lacy | 324/84 |
| 3,517,309 | 6/1970 | Gerst | 324/84 |
| 3,518,541 | 6/1970 | Travia et al. | 324/84 |
| 4,206,403 | 6/1980 | Tucker | 324/95 |

*Primary Examiner*—Michael J. Tokar
*Attorney, Agent, or Firm*—Cushman, Darby & Cushman

[57] ABSTRACT

The present invention provides microwave instantaneous frequency measurement apparatus which includes a power divider (2) for dividing an RF input signal line (4) for delaying the first signal, a 3 decibel hybrid coupler (5) for quadrature summing and differencing the delayed first signal and the second signal, a pair of logarithmic amplifiers (10, 11) connected to receive sum and difference outputs from the coupler, and a substrator (12) arranged to subtract the outputs from the amplifiers.

3 Claims, 6 Drawing Figures

MICROWAVE INSTANTANEOUS FREQUENCY MEASUREMENT APPARATUS

The present invention relates to apparatus for the instantaneous measurement of the frequency of pulsed microwave signals and particularly relates to the frequency measurement of pulsed radar where a train of pulses from one radar source has to be distinguished and separated from radar pulses from another source on a real-time, pulse to pulse basis.

A known microwave frequency measurement apparatus employs an input amplifier which is driven into saturation to remove the effects of amplitude variation, and a microwave phase detector.

The present invention provides microwave frequency measurement apparatus which gives improved performance compared with known apparatus at low level signal inputs where signal-to-noise ratios are low and frequency measurement of a single pulse becomes noisy. In the known apparatus a signal-to-noise limit is reached where signal degradation prohibits the technique of integration over a number of pulses to improve measurement accuracy.

According to the present invention, microwave instantaneous frequency measurement apparatus comprises a power divider for dividing a RF input signal into first and second signals, means for introducing time delay into said first signal, a 3 decibel hybrid coupler for quadrature summing and differencing the delayed first signal and the second signal, a pair of logarithmic amplifiers connected to receive sum and difference outputs from the coupler, and a subtractor arranged to subtract the outputs from the amplifiers.

The sum and difference outputs may be fed to the logarithmic amplifiers via matched crystal video detectors.

Output from the subtractor may be fed to a digital readout via a sample and hold circuit.

An embodiment of the present invention will now be described, by way of example only, with reference to the drawings of which:

Figure 1:
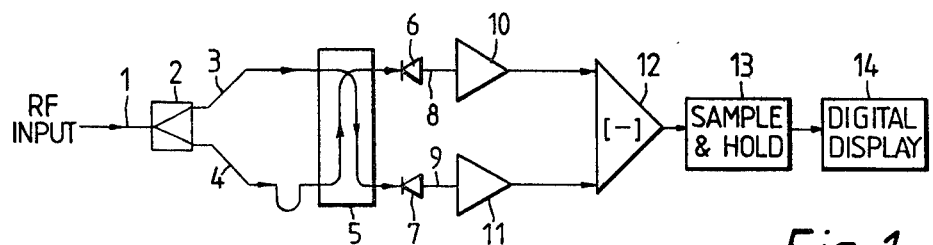
FIG. 1 is a schematic circuit diagram of a microwave instantaneous frequency measurement apparatus in accordance with the invention.

An RF input signal on a line 1 is divided in an inphase, 3 db power divider 2 into two outputs which are fed to two lines 3, 4 of unequal electrical length, line 4 being longer than line 3. The lines 3, 4 are connected to respective input ports of a 3 db, 90° hybrid coupler 5 which divides the inputs equally as regards power and feeds corresponding signals to two output ports directly and also in phase quadrature. Signals from the output ports are fed to lines 8 and 9 via matched detectors 6, 7 respectively. The detected outputs on lines 8 and 9 are fed to matched logarithmic video amplifiers 10, 11 respectively and the outputs of the amplifiers subtracted in a substractor 12. Output from the subtractor 12 is fed to a digital display 14 via a sample and hold circuit 13.

Figure 2:
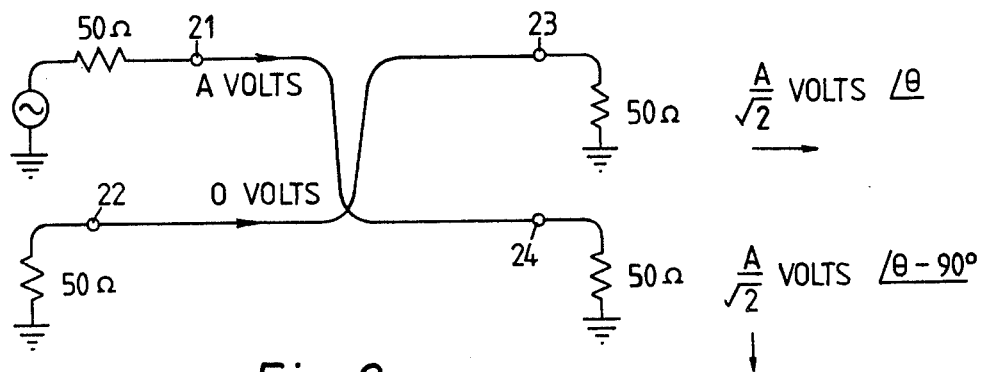
FIG. 2 is a diagram of a 3 decibel hybrid coupler which forms part of the circuit of FIG. 1.
Figure 3:
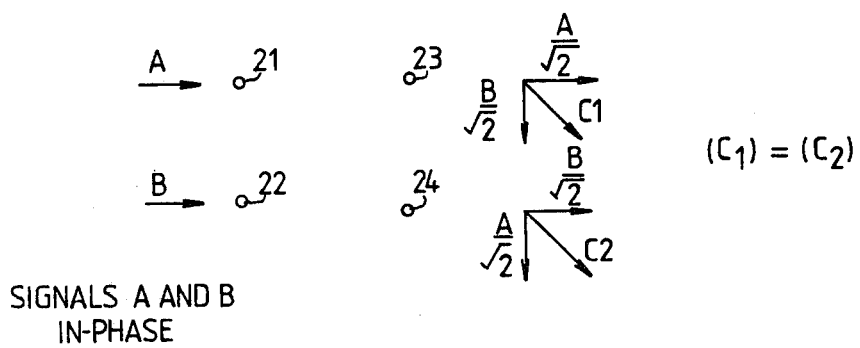
FIG. 3 shows relative phase angles at output, and resultant vectors $C_1$, $C_2$ for inphase inputs to the coupler of FIG. 2.
Figure 4:
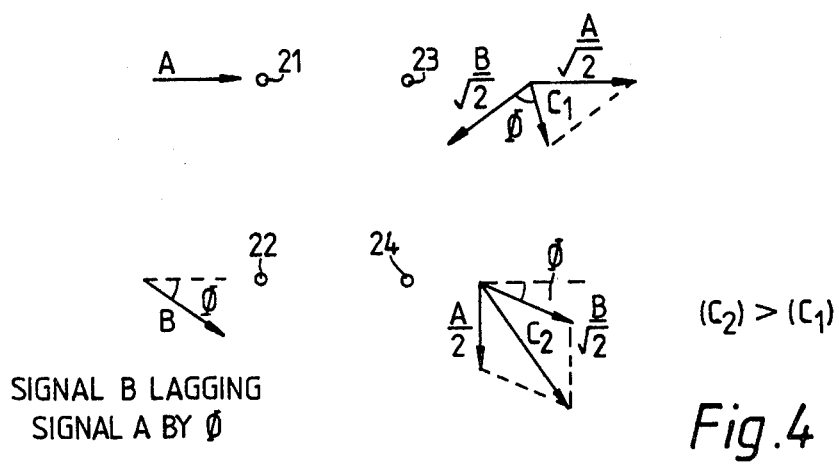
FIG. 4 shows relative phase angles for out of phase inputs to the coupler of FIG. 2.

In operation, when a RF signal is fed to line 1 the signals input to the ports of coupler 5 will have a phase difference which is frequency dependent. The coupler 5 performs quadrature summing and differencing on the input signals. As the frequency of the input signal on line 1 is varied, the resulting phase variation at the inputs to the coupler 5 may be represented by two rotating vectors of equal magnitude at each output port. The signal relationships in the coupler are given in FIG. 2 and the modulus of the resultant vector is detected on the matched detectors 6, 7 giving an amplitude variation which is dependent on the phase difference between the two signals at the corresponding output ports of the coupler. The amplitude of the signal at the output of subtractor 12 will be independent of the amplitude of the received signal but dependent on the frequency of the signal.

Modifications and variations to the embodiment described, within the scope of the invention, will be apparent. For example, a longer delay line can be used to give greater frequency resolution at the expense of a reduced range of frequency over which an unambiguous measurement can be made.

Parallel channels with different line lengths may be added to give increased frequency resolution but with better resolution of ambiguities. Further, if the signal to be measured is at constant frequency, switched line lengths may be employed.

Banks of switched filters may be employed to resolve frequency to within the passband of the filters. Alternatively parallel channels each with a filter to provide a narrow unambiguous band may be used.

Figure 5:
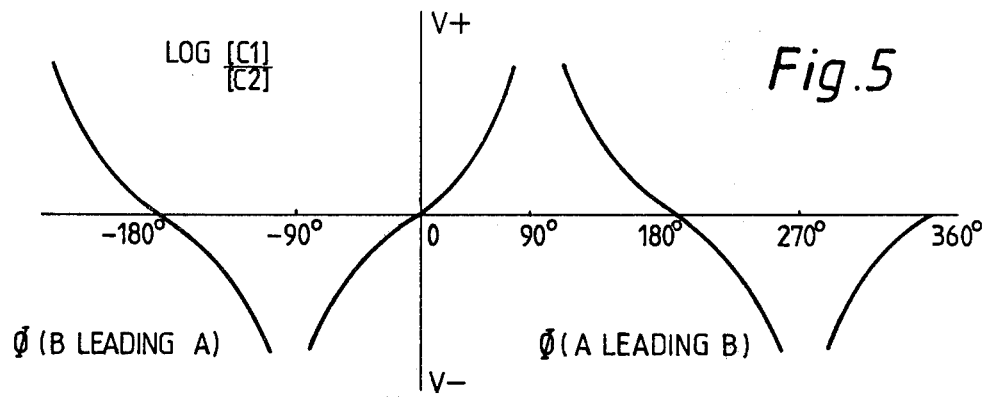
FIG. 5 is a graph of log $(C_1)/(C_2)$ against phase angle $\Phi$ for the apparatus.
Figure 6:
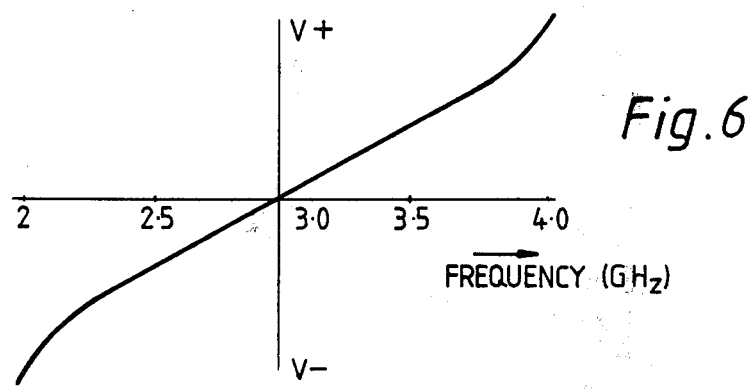
FIG. 6 is a graph showing performance characteristics of the apparatus.

A broadband phase shifter may be used to displace the curve of FIG. 5 to increase the unambiguous frequency range at the expense of reduced frequency resolution. Alternatively a switched broadband phase shifter may be used to resolve ambiguities.

The sensitivity of the embodiments described may be improved by the addition of a non-limiting broadband amplifier with or without automatic gain control to amplify the input signal.

We claim:

1. Microwave instantaneous frequency measurement apparatus comprising an RF input signal power divider for dividing said input signal into first and second signals, time delay means for introducing time delay into said first signal, a three decibel hybrid coupler connected to receive said delayed first signal and said second signal and arranged to quadrature sum and difference said delayed first signal and said second signal, a first logerithmic amplifier connected to receive quadrature summed output from said coupler, a second logarithmic amplifier connected to receive quadrature differenced output from said coupler, and a subtractor connected to receive output signals from both said amplifiers and to subtract the one from the other.

2. Microwave instantaneous frequency measurement apparatus comprising an RF input signal power divider for dividing said input signal into first and second signals, time delay means for introducing time delay into said first signal, a three decibel hybrid coupler connected to receive said delayed first signal and said second signal and arranged to quadraturesum and difference said first and second signal, first and second matched crystal video detectors, wherein said first detector is connected to receive quadrature summed output from said coupler and said second detector is connected to receive quadrature differenced output from said coupler, first and second logarithmic amplifiers connected to receive outputs from said first and second detectors, respectively, and a subtractor connected to receive output signals from both said amplifiers and to subtract the one from the other.

3. Microwave instantaneous frequency measurement apparatus as claimed in claim 1 or claim 2, further including a sample-and-hold circuit connected to a digital readout, wherein the output of the subtractor is fed to the readout via said sample-and-hold circuit.

* * * * *